US007000137B2

(12) United States Patent
Sivaraman et al.

(10) Patent No.: US 7,000,137 B2
(45) Date of Patent: Feb. 14, 2006

(54) SYSTEM FOR AND METHOD OF CLOCK CYCLE-TIME ANALYSIS USING MODE-SLICING MECHANISM

(75) Inventors: Mukund Sivaraman, Mountain View, CA (US); Shail Aditya Gupta, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 491 days.

(21) Appl. No.: 10/266,830

(22) Filed: Oct. 7, 2002

(65) Prior Publication Data

US 2004/0068705 A1 Apr. 8, 2004

(51) Int. Cl.
*G06F 1/04* (2006.01)
*G06F 9/45* (2006.01)

(52) U.S. Cl. .......................................... 713/500; 716/6

(58) Field of Classification Search ................ 713/500; 716/6

See application file for complete search history.

(56) References Cited

U.S. PATENT DOCUMENTS

| | | | | |
|---|---|---|---|---|
| 5,764,951 | A | 6/1998 | Ly et al. | |
| 5,801,958 | A | 9/1998 | Dangleo et al. | |
| 5,870,308 | A | 2/1999 | Dangleo et al. | |
| 5,930,510 | A | 7/1999 | Beylin et al. | |
| 5,963,730 | A | 10/1999 | Toyonaga et al. | |
| 6,096,092 | A | 8/2000 | Takahashi et al. | |
| 6,105,139 | A | 8/2000 | Dey et al. | |
| 6,216,252 | B1 | 4/2001 | Dangleo et al. | |
| 6,324,678 | B1 | 11/2001 | Dangleo et al. | |
| 6,374,403 | B1 | 4/2002 | Darte et al. | |
| 6,438,747 | B1 | 8/2002 | Schreiber et al. | |
| 6,457,159 | B1 * | 9/2002 | Yalcin et al. | 716/6 |
| 6,460,173 | B1 | 10/2002 | Schreiber | |
| 6,463,576 | B1 | 10/2002 | Tomoda | |
| 6,493,863 | B1 | 12/2002 | Hamada et al. | |
| 6,625,797 | B1 | 9/2003 | Edwards et al. | |
| 6,634,024 | B2 | 10/2003 | Tirumalai et al. | |
| 6,662,271 | B2 | 12/2003 | Smits | |
| 6,678,871 | B2 | 1/2004 | Takeyama et al. | |
| 6,684,376 | B1 | 1/2004 | Kerzman et al. | |
| 2004/0046590 | A1 | 3/2004 | Singh et al. | |
| 2004/0068331 | A1 | 4/2004 | Cronquist et al. | |
| 2004/0068711 | A1 | 4/2004 | Gupta et al. | |
| 2004/0068718 | A1 | 4/2004 | Cronquist et al. | |

OTHER PUBLICATIONS

Kirkpatrick, T.I and N. R. Clark, "PERT as an Aid to Logic Design", IBM Journal of Research and Development, vol. 10 (1996) pp. 135-141.*

"Managing Design Complexity with Behavioral Synthesis", [on-line] [Retrieved On: Sep. 10, 2002] Retrieved from: http://www.synopsis.com/products/beh syn/beh syn-br.html (pp. 1-14).*

Gert Goossens et al., Loop optimization in register-transfer scheduling for DSP-systems, Proceedings of the 26th ACM/IEEE conference on Design automation, 1989, pp. 826-831, ACM Press, New York NY.

(Continued)

*Primary Examiner*—Lynne H. Browne
*Assistant Examiner*—Stefan Stoynov

(57) ABSTRACT

A method for performing a global timing analysis of a proposed digital circuit comprising receiving timing models and the proposed digital circuit; determining at least one mode of circuit operation of the proposed digital circuit; deriving a sub-circuit corresponding to each of at least one mode of circuit operation; performing timing analysis on each of the sub-circuits derived corresponding to each of the modes; and combining the timing analysis results for all of the modes to determine an overall maximum circuit delay.

62 Claims, 2 Drawing Sheets

OTHER PUBLICATIONS

R. Govindarajan et al., A Novel Framework for Multi-Rate Scheduling in DSP Applications, Proceedings of the 1993 International Conference on Application Specific Array Processors, 1993, pp. 77-88, IEEE Press, Piscataway, NJ.
John C. Gyllenhaal et al., HMDES Version 2.0 Specification, Technical Report IMPACT-96-3, 1996, University of Illinois at Urbana-Champaign, Urbana, IL.
D. J. Kuck et al., Dependence Graphs and Compiler Optimizations, Proceedings of the 8th ACM SIGPLAN-SIGACT symposium on Principles of programming languages, 1981, pp. 207-218, ACM Press, New York, NY.
Andreas Kuehlman et al., Timing Analysis in High-Level Synthesis, Proceedings of the 1992 IEEE/ACM international conference on Computer-aided design, 1992, 349-354, IEEE Computer Society Press, Los Alamitos, CA.
Tai A. Ly et al., Applying Simulated Evolution to Scheduling in High Level Synthesis, Proceedings of the 33rd Midwest Symposium on Circuits and Systems, 1990, vol. 1, pp. 172-175, IEEE Press, Piscataway NJ.
John A. Nestor et al., SALSA: A New Approach to Scheduling with Timing Constraints, Proceedings of the International Conference on Computer Aided Design, 1990. pp. 262-265 IEEE Computer Society, Los Alamitos, CA.
William Pugh, A Practical Algorithm for Exact Array Dependence Analysis, 1992, 35(8):102-114, ACM Press, New York, NY.
B. R. Rau, Data Flow and Dependence Analysis for Instruction Level Parallelism, Lecture Notes in Computer Science, vol. 589, Proceedings of the Fourth International Workshop on Languages and Compilers for Parallel Computing, 1991, pp. 236-250, Springer-Verlag, London, UK.
B. Ramakrishna Rau, Iterative Modulo Scheduling, HP Labs Technical Report HPL-94-115, 1995, Hewlett-Packard, Palo Alto, CA.
Michael Schlansker et al., Acceleration of First and Higher Order Recurrences on Processors with Instruction Level Parallelism, Lecture in Computer Science: vol. 768, Proceedings of the 6th International Workshop on Languages and Compilers for Parallel Computing, 1993, pp. 406-429, Springer-Verlag, London UK.
Robert Schreiber et al., High-Level Synthesis of Nonprogrammable Hardware Accelerators, Tech Report: HPL-2000-31, 2000, Hewlett-Packard, Palo Alto, CA.
Robert Schreiber et al., PICO-NPA: High-Level Synthesis of Nonprogrammable Hardware Accelerators, HPLabs : Tech Report: HPL-2001-249, Oct. 16, 2001, Hewlett Packard, Palo Alto, CA.
U.S. Appl. No. 09/378,298, Schreiber et al.
U.S. Appl. No. 10/266,826, Sivaraman et al.
U.S. Appl. No. 10/266,831, Sivaraman et al.
Leiserson, C.E. and J. B. Saxe, "Retiming Synchronous Circuitry", Systems Research Center of Digital Equipment Corporation in Palo Alto, California, (Aug. 20, 1986).
Kirkpatrick, T.I. and N. R. Clark, "PERT as an Aid to Logic Design", IBM Journal of Research and Development, vol. 10 (1996) pp. 135-141.
Devadas,S., et al. "Computation of Floating Mode Delay in Combinational Logic Circuits: Theory and Algorithms" IEEE Transactions on Computer-Aided Design of Integrated Circuits and Systems, vol. 12 (Dec. 1993) pp. 1913-1923.
Charlesworth, A.E. "An Approach to Scientific Array Processing: The Architectural Design of the AP-120B/FPS-164 Family", Computer, vol. 14, No. 9 (Sep. 1981) pp. 18-27.
Rau, B. R. "Iterative Modulo Scheduling", International Journal of Parallel Programming, vol. 24, No. 1 (1996) pp. 3-64.
"Managing Design Complexity with Behavioral Synthesis", [on-line] [Retrieved On: Sep. 10, 2002] Retrieved from: http://www.synopsis.com/products/beh_syn/beh_syn_br.html (pp. 1-14).
Behavioral Compiler User Guide, Chapter 3, "Optimizing Timing and Area," pp. 3-1 through 3-78, v. Nov. 2000.
Malik, S. "Analysis of Cyclic Combinational Circuits" IEEE Transactions on Computer-Aided Design of Integrated Circuits and Systems, vol. 13, No. 7 (Jul. 1994) pp. 950-956.
Srinivasan, A. and Sharad Malik, "Practical Analysis of Cyclic Combinational Circuits" IEEE Custom Integrated Circuits Conference (1996) pp. 381-384.

* cited by examiner

SYSTEM FOR AND METHOD OF CLOCK CYCLE-TIME ANALYSIS USING MODE-SLICING MECHANISM

CROSS-REFERENCE TO RELATED APPLICATIONS

The present application is related to commonly-assigned U.S. patent application Ser. No. 10/266,831 entitled "METHOD FOR DESIGNING MINIMAL COST, TIMING CORRECT HARDWARE DURING CIRCUIT SYNTHESIS," and U.S. patent application Ser. No. 10/266,826 entitled "METHOD OF USING CLOCK CYCLE-TIME IN DETERMINING LOOP SCHEDULES DURING CIRCUIT DESIGN," filed concurrently herewith, the disclosures of which are hereby incorporated by reference in their entireties.

FIELD OF THE INVENTION

The present invention is directed to digital circuit verification and, in particular, to timing analysis of digital circuits.

BACKGROUND

Continuing advances in technology combined with dropping production costs have led to a proliferation of electronic devices that incorporate or use advanced digital circuits including desktop computers, laptop computers, hand-held devices, such as Personal Digital Assistants (PDA), and hand-held computers, cellular telephones, printers, digital cameras, facsimile machines and other electronic devices. These digital circuits are typically required to provide the basic functionality of the electronic device. Digital circuits may also be incorporated in many other household or business appliances. To continue to develop and produce these digital circuits, fast, efficient means of synthesizing and/or designing these circuits are required. In addition, at each step of the design process, it is necessary to verify the correct operation of these digital circuits.

Digital circuit verification includes, (1) ensuring that the circuit performs the correct functionality and (2) ensuring that the circuit satisfies the timing requirements. Functional verification ensures that the circuit produces the correct result or output. Timing verification ensures that the correct output is produced within a given amount of time or that the output is available when it is required. One possible approach for timing verification is timing simulation where the functionality and delay of each component in the circuit is used to repeatedly simulate the circuit response for each input stimulus from a set of input stimuli. The disadvantage of timing simulation is that the verification cannot be guaranteed for the input stimuli that have not been simulated. An alternative approach to timing verification is timing analysis, which overcomes this disadvantage by analyzing (rather than simulating) the circuit for all stimuli that can possibly occur at the circuit-inputs. Furthermore, timing analysis can also be used to determine the maximum circuit delay, as opposed to simply ensuring that the circuit satisfies the given timing requirements.

Typically, a clock is used to coordinate the sequence of events performed by the digital circuit. This coordination is referred to as synchronization. The period of time between successive clock cycles is the clock period.

Analyzing the timing of a digital circuit includes an examination of the circuit path from the primary input or latching element, through one or more combinational circuit components to a primary output or latching element. A combinational circuit component is one whose output function depends solely on the input values applied to it, not on any past history or internal state. Latching elements include registers, d-type and similar type flip-flops or other storage devices that store the value present at its input upon the occurrence of a synchronization event, such as a clock edge. Timing analysis ensures that the delays along a circuit path from the input to the output are less than the period of time between the synchronization events, such as successive clock cycles.

The simplest form of timing analysis performs only topological analysis, i.e., it only accounts for the delay of each component and their interconnectivity (the way they are connected with each other) and ignores the functionality of the circuit components. One of the earliest timing analysis tools which followed this approach was Program Evaluation and Review Technique (PERT), which calculated the maximum delay of a circuit as the delay of the topologically longest path in the circuit. The run-time complexity of this analysis is "big O of M," i.e., O(M), where M stands for the number of circuit components. In other words, the time it takes to perform this analysis is linearly proportional to the circuit size. Any timing analysis algorithm will have to look at each circuit component at least once during its analysis, therefore a run-time complexity that is linearly proportional to circuit size is optimal (and hence, desirable). PERT is described in T. I. Kirkpatrick and N. R. Clark, "PERT as an aid to logic design," IBM Journal of Research and Development, vol. 10, 1966, pp. 135–141 which is hereby incorporated by reference in its entirety.

Unfortunately, there are two drawbacks with PERT: (1) it over-estimates the maximum circuit delay because it does not account for false paths, and (2) it cannot handle combinational loops that may be present in the circuit.

A path is said to be false or unsensitizable when a signal cannot propagate from the beginning to the end of the path under any combination of primary inputs. FIG. 1 illustrates a sensitization example.

Unit gate delays and zero wire delays are assumed in the following functional analysis of FIG. 1. Input 101 is connected to non-inverting buffer 102, output 104 of buffer 102 is connected to a first input of AND gate 105 and input 103 is connected to a second input of AND gate 105. Input 103 is also connected to buffer 106. Output 107 of AND gate 105 is connected to a first input of OR gate 109 and output 108 of buffer 106 is connected to a second input of OR gate 109. OR gate 109 has output 110.

The circuit path starting at input 101, through buffer 102, output 104, AND gate 105, output 107, OR gate 109 and output 110 has a delay of three units (one unit delay for each of buffer 102, AND gate 105 and OR gate 109). For a rising or falling transition (at time zero) to propagate from input 101 through this circuit path to output 110, the second input (103) of AND gate 105 must be a logic 1 (non-controlling or sensitizing value) at the time the transition propagates through AND gate 105 (i.e., at time t=1 unit). In order for this to occur, input 103 should be a logic 1 at time t=1 unit. Similarly, the second input (108) to OR gate 109 must be at logic 0 (non-controlling or sensitizing value) at the time the transition along the path propagates through OR gate 109 (i.e., at time t=2 units). In order for this to occur, the output of buffer 106 should be a logic 0 at time t=2 units, which implies that input 103 should be a logic 0 at time t=1 unit. It is seen that to meet these two criteria, input 103 is required to be both a logic 1 and a logic 0 at time=1 unit which is not possible. Therefore, a transition cannot propagate through this circuit path. This path is therefore not sensitizable. The maximum delay of this circuit path is therefore less than three units, but PERT will evaluate the circuit delay as three units since the topologically longest path in the circuit is equal to three units.

Several algorithms have been proposed in the literature to perform timing analysis accounting for false paths. An example of such an algorithm is S. Devadas, K. Keutzer, and S. Malik, "Computation of floating mode delay in combinational logic circuits: Theory and algorithms," IEEE Transactions on Computer-Aided Design of Integrated Circuits and Systems, vol. 12, December 1993, pp. 1913–1922. These algorithms are able to determine the maximum circuit delay with greater accuracy, however, they have super-linear run-time complexity (i.e., their run-time scales worse than linearly with respect to circuit size), so they are less efficient than purely topological timing analysis (i.e., PERT). Moreover, they still cannot handle combinational loops that may be present in the circuit.

A loop in a circuit occurs when a combinational path goes through the same combinational component more than once. Combinational components include AND gates, OR gates, etc., but excludes latches and registers. A loop is said to be combinational when, in spite of the structural feedback, there is no logical feedback that is transmitted to the primary outputs. In other words, a signal cannot go completely around a combinational loop and then propagate to a primary output (it will be stopped either before it completes one entire loop, or before it reaches the primary output).

Several techniques have been proposed in the literature to perform timing analysis accounting for combinational cycles. One example is found in S. Malik, "Analysis of cyclic combinational circuits," IEEE Transactions on Computer-Aided Design of Integrated Circuits and Systems, vol. 13, No. 7, July 1994, pp. 950–956, the disclosure of which is incorporated by reference herein. Malik has proposed a technique for estimating the maximum delay of any given cyclic combinational circuit by unrolling the cyclic circuit to obtain an equivalent acyclic circuit. This potentially makes the circuit large and complex. This technique relies on Binary Decision Diagrams (BDDs) for the necessary logical analysis. These factors make the technique impractical for large circuits. Another example is found in A. Srinivasan and S. Malik, "Practical analysis of combinational circuits," Proceedings Custom Integrated Circuits Conference, 1996, pp. 381–384, the disclosure of which is incorporated by reference herein. Srinivasan and Malik have proposed a heuristic process for handling a restricted case of cyclic combinational circuits. This is based on finding a minimal set of gates that, when removed, results in an acyclic circuit. The heuristic process is super-linear in run-time complexity, therefore the authors proposed a user-specified budget to terminate the heuristic unsuccessfully if it exceeds the budget.

In summary, timing analysis that does not account for false paths and combinational loops, although being of linear run-time complexity, over-estimates the maximum delay of a circuit. Algorithms that include false paths and combinational loops analysis are super-linear in run-time complexity and, therefore, less efficient.

SUMMARY OF THE INVENTION

A method of performing a global timing analysis of a proposed digital circuit comprising receiving timing models and said proposed digital circuit; determining a plurality of modes of circuit operation of said proposed digital circuit; deriving a sub-circuit corresponding to each of said modes of circuit operation; performing timing analysis on each of said sub-circuits derived corresponding to each of said modes; and combining the timing analysis results for said modes to determine an overall maximum circuit delay.

DETAILED DESCRIPTION

Figure 1:
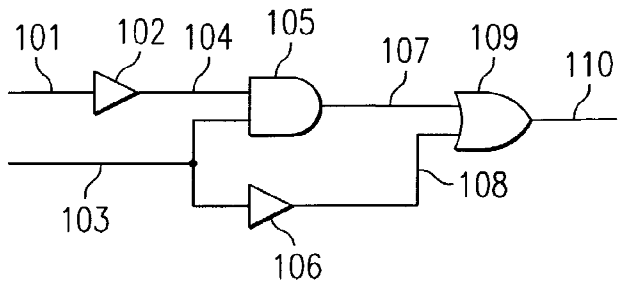
FIG. 1 is a schematic diagram of a logic circuit useful for a sensitization example.
Figure 2:
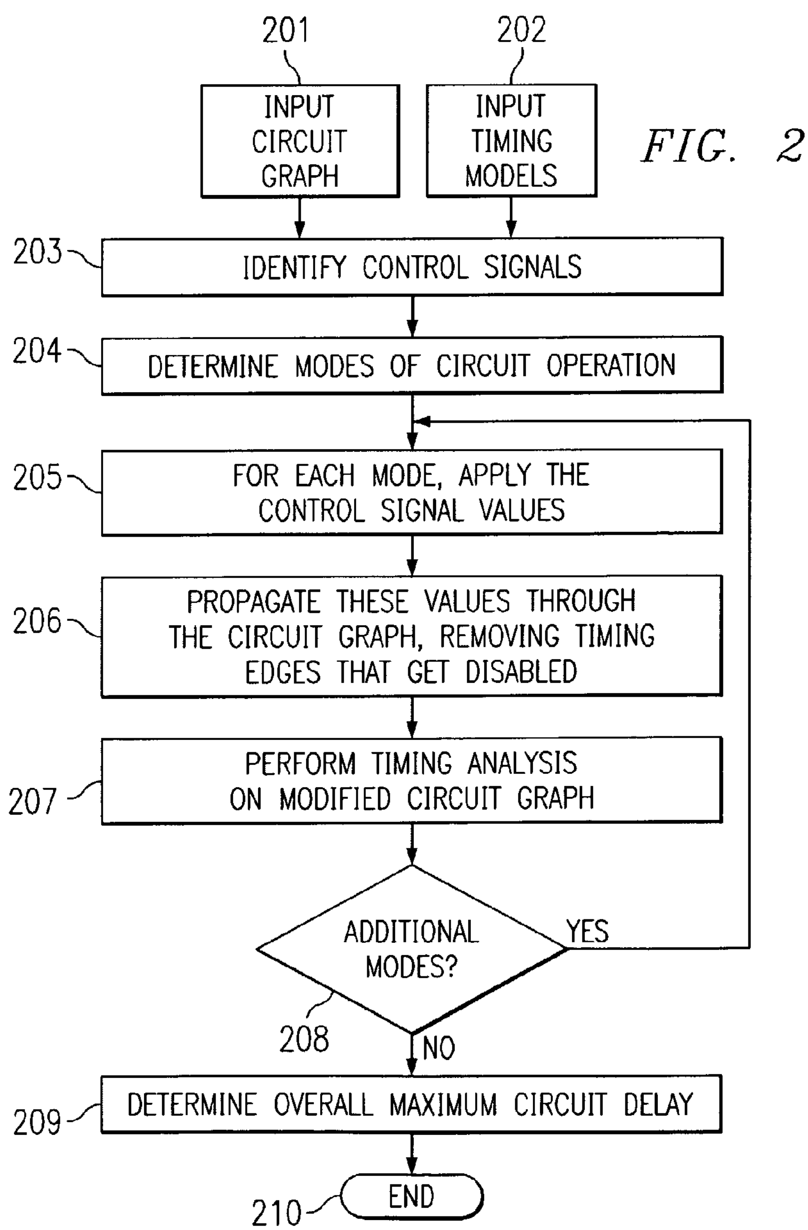
FIG. 2 is a flow diagram of an embodiment of the present invention for analyzing a digital circuit by a mode-sliced method.

FIG. 2 is a flow diagram of an embodiment of the present invention for performing timing analysis of a digital circuit by a mode-sliced method. The flow diagram of FIG. 2 shows the provision of two inputs associated with respective input steps: input circuit graph step 201, and timing models input step 202. Input circuit graph step 201 includes providing descriptions of circuit components and the interconnections between the components of the digital circuit. A component is considered to be a hardware element that performs a set of one or more functions or operations. Muliplexers, registers, AND gates, adders, and subtractors are examples of components. The functionality of the component is also received in step 201. Interconnections refers to wires or other signal conductors that are capable of transporting data values (or signal values) in the form of electrical signals, from one point to a second point.

In step 202 timing models are received. Timing models are received for the components and the interconnections received in step 201. Timing models for components and interconnections include timing edges and associated delay values for the timing edges. A delay is associated with the time required to execute an operation and/or propagate a result. For instance, the timing model for an adder with two inputs in0 and in1 and one output out0 will contain: 2 timing edges (one from in0 to out0 and another from in1 to out0) and a delay value associated with each timing edge. The delay value represents the maximum time it takes for an electrical signal to propagate from the appropriate input to the output of the adder when an addition operation is performed.

In step 203 a subset of input signals that control the sensitization of long circuit paths are identified. Long paths in circuits determine the maximum circuit delay. The identified input signals are designated as control signals. An example of a control signal is the select input of a multiplexer that is used along a long circuit path.

The set of all possible combinations of a Boolean value of a "0" or "1" to each control signal that was identified in step 203 represents all the possible ways in which the circuit operates from a timing analysis perspective. Each such combination of control signal values is a control state. A mode comprises a set of control states such that, a mode of the circuit corresponds to an assignment of "0" or "1" or unknown "U" values to the control signals. In step 204 the modes of circuit operation for which timing analysis is to be performed are determined. The modes are selected such that every possible control state is in at least one mode, so that the set of modes cover the space of all possible control states of the circuit. Furthermore, the modes are determined such that, in each mode, the control signals that influence the sensitization of those long paths that are sensitized in this mode are assigned a "0" or a "1" value. Note that there is a trade-off between the granularity of the mode and the minimum number of modes required to cover all of the control states. At one extreme, each mode consists of exactly one control state, in which case, there need to be as many modes as control states. On the other extreme, there may be only one mode representing all possible control states. After the completion of step 204, control signals and associated modes have been identified.

Each mode identified in step 204 is individually considered in steps 205, 206 and 207. In step 205, values corresponding to the mode under consideration are applied to the control signals. In other words, for control signals that have been assigned a "0" or a "1" value within the mode, the control signal inputs are set to the appropriate value.

In step 206, the timing edges for the component and interconnections are annotated onto the input circuit description to form a circuit graph amenable to timing analysis. The "0" or "1" control signal values are then propagated through this circuit graph resulting a modified circuit graph wherein the timing edges which become disabled are removed from further consideration. Disabled timing edges are those timing edges through which no signal propagates in the mode under consideration. After completion of step 206, a sub-circuit graph remains which consists of timing edges that have not been proven to be inactive in the mode under consideration.

Timing analysis is then performed in step 207 on the modified circuit graph to determine the maximum delay for this mode. Any timing analyzer can be used for this purpose. By virtue of step 206, many false paths and combinational loops have been eliminated from the circuit graph, therefore, a simple timing analyzer may be used. In a preferred embodiment, a PERT-like timing analyzer can be used.

In step 208 determination is made as to whether additional modes remain to be considered. If additional modes are available, step 205 is again encountered to begin the examination of remaining modes. Once all modes have been examined, step 209 determines the overall maximum circuit delay. Since steps 205–207 perform the timing analysis for every individual mode of the circuit, and the modes selected by step 204 cover all possible states, the overall maximum delay of the circuit is equal to the maximum of the maximum delay determined within each mode. Note that the steps of FIG. 2 may be implemented within a program stored on computer readable media.

The methodology of FIG. 2 eliminates the false paths and combinational loops from consideration and results in an extremely efficient analysis methodology. In a preferred embodiment where a PERT-like timing analyzer is used, the run-time complexity of PERT is O(M) where M is the circuit size. If the number of modes determined in step 204 is N, the total run-time complexity of the global timing analysis method of FIG. 2 is O(NM). The number of modes N is independent of circuit size. Therefore, the global timing analysis still has linear run-time complexity. This is an improvement over prior approaches that account for false paths and combinational loops with super-linear run-time complexity.

While the flow diagram of FIG. 2 is applicable to any digital hardware circuit, it is especially beneficial for the timing analysis for certain classes of circuits. In one embodiment, the timing of a circuit datapath that is controlled by a Finite-State Machine (FSM) based controller may be efficiently analyzed using the flow diagram of FIG. 2. In this example, the control signals are the signals that originate from the FSM controller and are sent to the datapath elements. Also in this example, each mode to be analyzed corresponds to a state of the FSM.

In a second embodiment, the timing of a periodic circuit may be efficiently analyzed using the flow diagram of FIG. 2. Periodicity means that the operation of every component in the circuit repeats every N clock cycles. Additionally, periodicity requires that the operation of every component which provides an input to the components of the circuit as well as the operation of every component that receives an output from the components of the circuit also repeat every N clock cycles. In this case, there is a periodicity of N clock cycles. In other words, the general circuit operation repeats every N clock cycles, such that only the data being operated on changes from cycle to cycle without necessarily repeating every N cycles. For example, a Functional Unit (FU) will execute the same operation every N cycles. Moreover, the locations from which the FU receives the input operand values and the locations to which the FU writes its results, also repeats every N cycles. However, the input data values may differ as may the resultant date output signal(s). Note that FUs are components that are capable of performing some set of operations, e.g., an adder can add two numbers, a multiplier can multiply two numbers, a multiply-add unit may be capable of multiplying two numbers, adding two numbers, or multiplying two numbers and adding the product with a third number.

In the methodology of FIG. 2, the N clock cycles of the periodicity of the digital circuit are split into N modes for the timing analysis. Each of the N modes is associated with a phase or a distinct clock cycle of the overall periodicity. To enable this, the signals that determine what phase the circuit is operating in are designated to be the control signals. Some examples of periodic circuits are those that execute software pipelined code and those that execute modulo scheduled code. Software pipelining is described in A. E. Charlesworth, "AN APPROACH TO SCIENTIFIC ARRAY PROCESSING: THE ARCHITECTURAL DESIGN OF THE AP-120B/FPS-164 FAMILY," computer, vol. 14, No. 9, September 1981, pp. 18–27, the disclosure of which is hereby incorporated by reference herein. Modulo scheduling is described in B. R. Rau, "ITERATIVE MODULO SCHEDULING," International Journal of Parallel Processing, vol. 24, pp. 3–64, 1996, the disclosure of which is hereby incorporated by reference herein. This document is also available as HP Labs Tech. Report HPL-94-115 from Hewlett-Packard Co.

In yet another embodiment of the invention, the flow diagram of FIG. 2 may be applied to the timing analysis of a circuit generated using Program-In-Chip-Out Nonprogrammable Accelerator (PICO-NPA) synthesis (refer to FIG. 24 and Section 5.10.2 of HP patent application HP10990413 titled "PROGRAMMATIC SYNTHESIS OF PROCESSOR ELEMENT ARRAYS", the disclosure of which is hereby incorporated by reference herein). PICO-NPA schema generated circuits have a periodic operation with a period of Initiation Interval (II) cycles. Additionally, the control signals are the phase bus bits and each mode to be analyzed corresponds to a distinct value that the phase bus may take.

Figure 3:
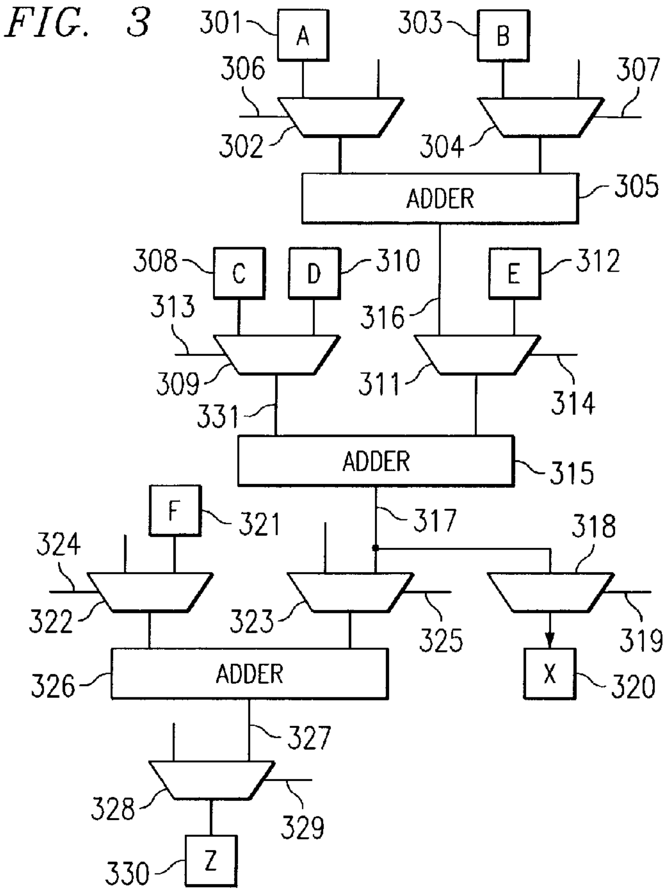
FIG. 3 is a schematic diagram of a circuit in which the method of FIG. 2 may be used to determine maximum circuit delay.

FIG. 3 shows an example circuit in which the method of FIG. 2 may be used to determine the maximum circuit delay.

In this circuit, signals 306, 307, 313, 314, 324, 325, 319 and 329 are all connected to the "phase" input. FIG. 3 depicts a circuit including input register 301, containing value "A", connected to a first input of multiplexer 302 and input register 303, containing value "B", connected to a first input of multiplexer 304. Multiplexers 302 and 304 also receive respective input select signal inputs 306 and 307. Outputs from both multiplexers 302 and 304 are electrically connected to respective addend signal inputs of adder 305. Input register 308, containing value "C", is connected to a first input of multiplexer 309 and input register 310, containing value "D", is connected to a second input of multiplexer 309.

Output 316 of adder 305 is connected to a first input of multiplexer 311 and input register 312, containing value "E", is connected to a second input of multiplexer 311. A select signal at input 313 causes the selection of an input for multiplexer 309 and a select signal at input 314 is used to select an input for multiplexer 311. Outputs for multiplexer 309 and multiplexer 311 are electrically connected to respective inputs of adder 315. The value present on output 317 of adder 315 may be selected through multiplexer 318 with the appropriate input select signal 319 and stored in output register 320. Input register 321, containing value "F", is connected to the second input of multiplexer 322 and output 317 of adder 315 is connected to the second input of multiplexer 323. Outputs of multiplexers 322 and 323 are electrically connected to adder 326. Output 327 of adder 326 may be selected by multiplexer 328 (with the appropriate select signal applied to input 329) and stored in output register 330.

When the "phase" input is '0', the select signals at inputs 306, 307, 313, 314 and 319 each causes multiplexers 302, 304, 309, 311 and 318 to pass the value present on their first inputs, as a result of which the sum A+B+C will be present on the output of multiplexer 318 and the value may be stored in output register 320. Also, when the "phase" input is '0', the select signals at inputs 324, 325 and 329 each causes multiplexers 322, 323 and 328 to pass the value present on their first inputs, as a result of which any signal at output 327 of adder 326 is not used and is considered a "don't care". Alternatively, when the "phase" input is '1', the select signals at inputs 306 and 307 each causes multiplexers 302 and 304 to pass the value present on their second inputs, as a result of which any signal at output 316 of adder 305 is not used and is considered a "don't care". Also, when the "phase" input is '1', the select signals at inputs 313, 314, 324, 325 and 329 each causes multiplexers 309, 311, 322, 323 and 328 to pass the value present on their second inputs, as a result of which the sum D+E+F will be present on the output of multiplexer 328 and the value may be stored in output register 330.

The method of FIG. 2 can be applied to the circuit of FIG. 3 as follows: an input circuit description representing the circuit of FIG. 3 is provided at step 201. Timing models for all the components and interconnections are provided at step 202. In step 203, the control signals are determined. The "phase" signal controls the sensitization of all paths in this circuit datapath. Therefore, it is designated as a control signal. In step 204, the states of the circuit operation, which correspond to all possible combinations of "0" or "1" control signal values, are grouped together to form modes. For this example, there are two states of circuit operation corresponding to when the control signal "phase" has value "0" and when the control signal "phase" has value "1". The modes are determined such that in each mode, the control signals that influence the sensitization of those long paths that are sensitized in this mode are assigned a "0" or a "1" value. Therefore, there are two modes, each consisting of exactly one state.

The global timing analysis is partitioned into two timing analyses, one for each mode. In the first mode, in step 205, the control signal "phase" takes value '0'. In step 206, this '0' value is propagated through the circuit, removing timing edges that get disabled. For example, "phase"='0', results in signal 306 being equal to '0', which disables the timing edge from the second input (i.e., rightmost as depicted) of multiplexer 302 to its output. Similarly, the other disabled timing edges are: from the second input of multiplexer 304 to its output; from the second input of multiplexer 309 to its output; from the second input of multiplexer 311 to its output; from the second input of multiplexer 322 to its output; from the second input of multiplexer 323 to its output; from the second input of multiplexer 319 to its output; and, from the second input of multiplexer 328 to its output. These timing edges are removed from the original circuit graph. In step 207, timing analysis is performed on the modified circuit graph resulting from step 206. The latch-to-latch paths consisting of only active timing edges and interconnects go through adder 305 and adder 315, or through adder 326. No path through all three adders is active, because the timing edge from the second input of multiplexer 323 to its output is disabled. Therefore, the maximum delay found for the circuit operating in the first mode will exclude the delay of these paths.

In the second mode, in step 205, the control signal "phase" takes value '1'. In step 206, this '1' value is propagated through the circuit, removing timing edges that get disabled. For example, "phase"='1', results in signal 306 being equal to '1', which disables the timing edge from the first input of multiplexer 302 to its output. Similarly, the other disabled timing edges are: from the first input of multiplexer 304 to its output; from the first input of multiplexer to its output; from the first input of multiplexer 311 to its output; from the first input of multiplexer 322 to its output; from the first input of multiplexer 323 to its output; from the first input of multiplexer its output; and, from the first input of multiplexer 328 to its output. These timing edges are removed from the original circuit graph. In step 207, timing analysis is performed on the modified circuit graph resulting from step 206. The latch-to-latch paths consisting of only active timing edges and interconnects go through adder 305, or through adder 315 and adder 326. No path through all three adders is active, because the timing edge from the first input of multiplexer 311 to its output is disabled. Therefore, the maximum delay found for the circuit operating in the second mode will exclude the delay of these paths.

After timing analysis has been performed for both modes of circuit operation, step 209 determines the overall maximum circuit delay by taking the maximum of the delays found in each mode. Since no path that goes through all three adders is active in any mode, the overall maximum delay thus determined will exclude the delay of all paths that go through all three adders. It can be noted that any path through all three adders is a false path, i.e., one that cannot be sensitized for any combination of input values. For instance, the path from register 301 through multiplexer 302 through adder 305 through multiplexer 314 through adder 315 through multiplexer 325 through adder 326 through multiplexer 328 to register 330 is false because, for a signal to go through this entire path, the "phase" input has to take both '0' and '1' values. Therefore, the method of FIG. 2 correctly and efficiently eliminates false paths from contributing to the maximum delay of a circuit.

Figure 4:
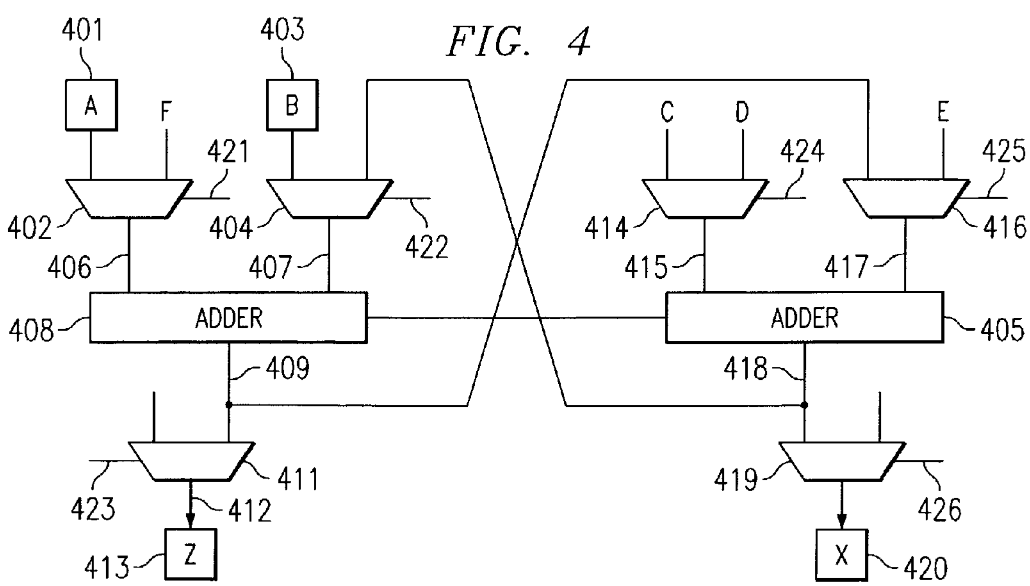
FIG. 4 is a schematic diagram of a circuit in which the method of FIG. 2 may be used to determine maximum circuit delay.

FIG. 4 illustrates another circuit for which an embodiment of the present invention may be used in timing analysis and to determine a maximum circuit delay. In this circuit, signals 421, 422, 423, 424, 425 and 426 are all connected to the "phase" input. Input "A" is connected to a first input of multiplexer 402 and input "F" is connected to a second input of multiplexer 402. Input "B" is connected to a first input of multiplexer 404 and the second input of a multiplexer 404 is connected to the output of adder 405. Output 406 of multiplexer 402 and output 407 of multiplexer 404 are electrically connected to respective inputs of adder 408. Output 409 of adder 408 is electrically connected to a first input of multiplexer 416 and second input of multiplexer 411. Output 412 of multiplexer 411 is connected to register 413. Multiplexer 414 has two inputs "C" on a first input and "D" on a second input. Output 415 of multiplexer 414 is electrically connected to a first input of adder 405. Multiplexer 416 has a first input electrically connected to output 409 of adder 408 and a second input connected to input "E." The second input of adder 405 is electrically connected to output 417 of multiplexer 416. Output 418 of adder 405 is electrically connected to a second input multiplexer 404 and a first input of multiplexer 419. Output 420 of multiplexer 419 is electrically connected to output register 420. Select signals are provided to respective inputs 421, 422, 423, 424, 425, and 426 of multiplexers 402, 404, 411, 416, and 419. Each of these select inputs are connected to a single "phase" input.

When the "phase" input is equal to '0', multiplexers 402, 404, 411, 414, 416 and 419 each connect the signal present on their first inputs to their respective outputs. With a select input of '0', signal "A" would be present on output 406 of multiplexer 402, and signal "B" would be present on output 407 of multiplexer 404, signal "C" would be present on output 415 of multiplexer 414 and the output of adder 408 would be present on output 417 of multiplexer 410. Therefore, the sum A+B will be present on the output of adder 409, and the sum A+B+C will be present on the output of adder 405 which will be stored in output register 420. Moreover, the '0' connected to control input 423 of multiplexer 411 would store a "don't care" into output register 413.

Alternatively, when the "phase" input is '1', a '1' value is applied to the select inputs 421, 422, 423, 424, 425, and 426 of multiplexers 402, 404, 411, 414, 416, and 419 respectively. For this select input, multiplexer 402 passes input "F" output 406 and multiplexer 404 passes output 418 of adder 405 to output 407 of multiplexer 404. Multiplexer 414 passes an input of "D" to its output 415 and multiplexer 416 passes the input "E" from its second input to output 417 of multiplexer 416. Adder 405 combines its two inputs, D and E and "D+E" is present on output 418 of adder 405. Adder 408 has an "F" on its first input and a "D+E" on its second input. "D+E+F" is therefore present on output 409 of adder 408 and "D+E+F" is stored in output register 413 through multiplexer 411 by virtue of a "1" on control signal 423. Moreover, the '1' connected to control input 423 of multiplexer 411 would store a "don't care" into output register 420.

The method of FIG. 2 can be applied to the circuit of FIG. 4 as follows: an input circuit description representing the circuit of FIG. 4 is provided at step 201. Timing models for all the components and interconnections are provided at step 202. In step 203, the control signals are determined. The "phase" signal (421–426) controls the sensitization of all paths in this circuit datapath, therefore it is designated as a control signal. In step 204, the states of the circuit operation, which correspond to all possible combinations of "0" or "1" control signal values, are grouped together to form modes. For this example, there are two states of circuit operation corresponding to when the control signal "phase" has value "0", and when the control signal "phase" has value "1". The modes are determined such that, in each mode, the control signals that influence the sensitization of those long paths that are sensitized in this mode are assigned a "0" or a "1" value. Therefore, there are two modes, each consisting of exactly one state.

The global timing analysis is partitioned into two timing analyses, one for each mode. In the first mode, in step 205, the control signal "phase" takes value '0'. In step 206, this '0' value is propagated through the circuit, removing timing edges that get disabled. For example, "phase"='0', results in signal 421 being equal to '0', which disables the timing edge from the second input (i.e., rightmost as depicted) of multiplexer 402 to its output. Similarly, the other disabled timing edges are: from the second input of multiplexer 404 to its output; from the second input of multiplexer 411 to its output; from the second input of multiplexer 414 to its output; from the second input of multiplexer 416 to its output; and, from the second input of multiplexer its output. These timing edges are removed from the original circuit graph. In step 207, timing analysis is performed on the modified circuit graph resulting from step 206. The timing edge from the second input of multiplexer 404 to its output is disabled, therefore any path that uses the interconnection from the output of adder 418 to the second input of multiplexer 404 is not sensitized in this mode. In other words, the combinational loop between the two adders is broken at this interconnect in the first mode. Therefore, the maximum delay found for the circuit operating in the first mode will exclude the combinational loop.

In the second mode, in step 205, the control signal "phase" takes value '1'. In step 206, this '1' value is propagated through the circuit, removing timing edges that get disabled. For example, "phase"='1', results in signal 421 being equal to '1', which disables the timing edge from the first input of multiplexer 402 to its output. Similarly, the other disabled timing edges are: from the first input of multiplexer 404 to its output; from the first input of multiplexer 411 to its output; from the first input of multiplexer 414 to its output; from the first input of multiplexer 416 to its output; and, from the first input of multiplexer its output. These timing edges are removed from the original circuit graph. In step 207, timing analysis is performed on the modified circuit graph resulting from step 206. The timing edge from the first input of multiplexer 416 to its output is disabled. Therefore, any path that uses the interconnection from the output of adder 408 to the first input of multiplexer 416 is not sensitized in this mode. In other words, the combinational loop between the two adders is broken at this interconnect in the second mode. Therefore, the maximum delay found for the circuit operating in the second mode will exclude the combinational loop.

After timing analysis has been performed for both modes of circuit operation, step 209 determines the overall maximum circuit delay by taking the maximum of the delays found in each mode. Since the combinational loop is broken by some disabled timing edge in every mode of circuit operation, the overall maximum delay thus determined will exclude the combinational loop. Therefore, the method of FIG. 2 correctly and efficiently eliminates combinational loops from contributing to the maximum delay of a circuit.

Note that the system for a method of clock cycle time analysis as described may be used to perform timing analysis on any circuit, including FSM controlled circuits, periodic circuits, software pipelined circuits, modulo scheduled circuits, and circuits designed by PICO-NPA. Additionally, the timing analysis of the present invention may be performed in a standalone environment, as well as in a high-level synthesis environment.

What is claimed is:

1. A method of performing a global timing analysis of a proposed digital circuit comprising:

receiving timing models and said proposed digital circuit, the proposed digital circuit being a periodic circuit;

determining a plurality of modes of circuit operation of said proposed digital circuit;

deriving a sub-circuit corresponding to each of said modes of circuit operation;

performing timing analysis on each of said sub-circuits derived corresponding to each of said modes; and combining the timing analysis results for said modes to determine an overall maximum circuit delay.

2. The method of claim 1 wherein said proposed digital circuit is received in the form of a circuit graph.

3. The method of claim 2 wherein said circuit graph includes components and interconnections between said components.

4. The method of claim 1 wherein said timing models are received for components and interconnections of said digital circuit.

5. The method of claim 4 wherein said timing models include timing edges and delays.

6. The method of claim 1 wherein said determination of at least one mode of circuit operation is performed by first determining control signals of said digital circuit.

7. The method of claim 6 wherein said control signals are associated with those signals that control the sensitization of circuit paths with large delay.

8. The method of claim 6 wherein said modes of circuit operation include all possible combinations of control signal values.

9. The method of claim 6 wherein said modes of circuit operation are determined such that in each mode, the control signals that influence the sensitization of those circuit paths with large delay that are sensitized in this mode are assigned a 0 or a 1 value.

10. The method of claim 6 wherein said control signal values are one of a "0" or a "1".

11. The method of claim 1 wherein:

said digital circuit is received in the form of a circuit graph;

said timing models including timing edges and delays; and said determination of at least one mode of circuit operation is performed by first determining control signals of said digital circuit.

12. The method of claim 11 wherein deriving a sub-circuit for each of said modes is done by:

applying values corresponding to each of said modes to said control signals;

propagating said control signal values through the circuit graph for each of said modes; and removing disabled timing edges from the circuit graph to create a modified circuit graph for each of said nodes.

13. The method of claim 12 further including:

disabling timing edges including those timing edges through which no signal propagates in each of said modes.

14. The method of claim 1 wherein said timing analysis is performed using Program Evaluation and Review Technique (PERT).

15. The method of claim 1 wherein said step of determining an overall maximum circuit delay includes:

identifying a mode containing a maximum delay.

16. The method of claim 1 wherein the proposed digital circuit comprises a circuit datapath that is controlled by a finite-state machine based controller.

17. A method of performing a global timing analysis of a proposed digital circuit comprising:

receiving timing models and said proposed digital circuit, the proposed digital circuit being produced as a result of software pipelining;

determining a plurality of modes of circuit operation of said proposed digital circuit;

deriving a sub-circuit corresponding to each of said modes of circuit operation;

performing timing analysis on each of said sub-circuits derived corresponding to each of said modes; and combining the timing analysis results for said modes to determine an overall maximum circuit delay.

18. The method of claim 17 wherein said proposed digital circuit is received in the form of a circuit graph including components and interconnections between said components.

19. The method of claim 18 wherein said timing models are received for said components and interconnections, said timing models including timing edges and delays.

20. The method of claim 17 wherein said determination of at least one mode of circuit operation is performed by first determining control signals of said digital circuit.

21. The method of claim 20 wherein deriving a sub-circuit for each of said modes is done by:

applying values corresponding to each of said modes to said control signals;

propagating said control signal values through the circuit graph for each of said modes; and removing disabled timing edges from the circuit graph to create a modified circuit graph for each of said nodes.

22. A method of performing a global timing analysis of a proposed digital circuit comprising:

receiving timing models and said proposed digital circuit, the proposed digital circuit being produced as a result of modulo scheduling;

determining a plurality of modes of circuit operation of said proposed digital circuit;

deriving a sub-circuit corresponding to each of said modes of circuit operation;

performing timing analysis on each of said sub-circuits derived corresponding to each of said modes; and combining the timing analysis results for said modes to determine an overall maximum circuit delay.

23. The method of claim 22 wherein said proposed digital circuit is received in the form of a circuit graph including components and interconnections between said components.

24. The method of claim 23 wherein said timing models are received for said components and interconnections, said timing models including timing edges and delays.

25. The method of claim 22 wherein said determination of at least one mode of circuit operation is performed by first determining control signals of said digital circuit.

26. The method of claim 25 wherein deriving a sub-circuit for each of said modes is done by:

applying values corresponding to each of said modes to said control signals;

propagating said control signal values through the circuit graph for each of said modes; and removing disabled timing edges from the circuit graph to create a modified circuit graph for each of said nodes.

27. A method of performing a global timing analysis of a proposed digital circuit comprising:

receiving timing models and said proposed digital circuit, the proposed digital circuit being produced by PICO-NPA synthesis;

determining a plurality of modes of circuit operation of said proposed digital circuit;

deriving a sub-circuit corresponding to each of said modes of circuit operation;

performing timing analysis on each of said sub-circuits derived corresponding to each of said modes; and combining the timing analysis results for said modes to determine an overall maximum circuit delay.

28. The method of claim 27 wherein said proposed digital circuit is received in the form of a circuit graph including components and interconnections between said components.

29. The method of claim 28 wherein said timing models are received for said components and interconnections, said timing models including timing edges and delays.

30. The method of claim 27 wherein said determination of at least one mode of circuit operation is performed by first determining control signals of said digital circuit.

31. The method of claim 30 wherein deriving a sub-circuit for each of said modes is done by:

applying values corresponding to each of said modes to said control signals;

propagating said control signal values through the circuit graph for each of said modes; and removing disabled timing edges from the circuit graph to create a modified circuit graph for each of said nodes.

32. A system for performing a global timing analysis of a proposed digital circuit comprising:

means for receiving timing models and said proposed digital circuit;

means for determining a plurality of modes of circuit operation of said proposed digital circuit, the proposed digital circuit being a periodic circuit;

means for deriving a sub-circuit corresponding to each of said modes of circuit operation;

means for performing timing analysis on each of said sub-circuits derived corresponding to each of said modes; and means for combining the timing analysis results for said modes to determine an overall maximum circuit delay.

33. The system of claim 32 wherein said proposed digital circuit is received in the form of a circuit graph.

34. The system of claim 33 wherein said circuit graph includes components and interconnections between said components.

35. The system of claim 32 wherein said timing models are received for components and interconnections of said digital circuit.

36. The system of claim 35 wherein said timing models include timing edges and delays.

37. The system of claim 32 wherein said determination of at least one mode of circuit operation is performed by first determining control signals of said digital circuit.

38. The system of claim 32 wherein said digital circuit is in the form of a circuit graph; said timing models include timing edges and delays; and said determination of at least one mode of circuit operation is performed by first determining control signals of said digital circuit.

39. The system of claim 38 further comprising:

means for applying values corresponding to each of said modes to said control signals;

means for propagating said control signal values through the circuit graph for each of said modes; and means for removing disabled timing edges from the circuit graph to create a modified circuit graph for each of said nodes.

40. The system of claim 39 further including:

means for disabling timing edges including those timing edges through which no signal propagates in each of said modes.

41. The system of claim 32 wherein said timing analysis is performed using Program Evaluation and Review Technique (PERT).

42. The system of claim 32 wherein said means for determining an overall maximum circuit delay further includes:

means for identifying a mode containing a maximum delay.

43. The system of claim 32 wherein the proposed digital circuit comprises a circuit datapath that is controlled by a finite-state machine based controller.

44. A system for performing a global timing analysis of a proposed digital circuit comprising:

means for receiving timing models and said proposed digital circuit;

means for determining a plurality of modes of circuit operation of said proposed digital circuit, the proposed digital circuit being produced as a result of software pipelining;

means for deriving a sub-circuit corresponding to each of said modes of circuit operation;

means for performing timing analysis on each of said sub-circuits derived corresponding to each of said modes; and means for combining the timing analysis results for said modes to determine an overall maximum circuit delay.

45. The system of claim 44 wherein the proposed digital circuit is further produced as a result of modulo scheduling.

46. The system of claim 44 wherein the proposed digital circuit is further produced by PICO-NPA synthesis.

47. A computer program product stored on computer readable media comprising computer code for implementing a method of performing a global timing analysis of a proposed digital circuit comprising steps of:

receiving timing models and said proposed digital circuit, the proposed digital circuit being a periodic circuit;

determining a plurality of modes of circuit operation of said proposed digital circuit;

deriving a sub-circuit corresponding to each of said modes of circuit operation;

performing timing analysis on each of said sub-circuits derived corresponding to each of said modes; and combining the timing analysis results for said modes to determine an overall maximum circuit delay.

48. The computer program product of claim 47 wherein said proposed digital circuit is received in the form of a circuit graph.

49. The computer program product of claim 48 wherein said circuit graph includes components and interconnections between said components.

50. The computer program product of claim 47 wherein said timing models are received for components and interconnections of said digital circuit.

51. The computer program product of claim 50 wherein said timing models include timing edges and delays.

52. The computer program product of claim 47 wherein said determining at least one mode of circuit operation is performed by first determining control signals of said digital circuit.

53. The computer program product of claim 52 wherein said control signals are associated with those signals that control the sensitization of circuit paths with large delay.

54. The computer program product of claim 52 wherein said modes of circuit operation include all possible combinations of control signal values.

55. The computer program product of claim 52 wherein said modes of circuit operation are determined such that in each mode, the control signals that influence the sensitization of those circuit paths with large delay that are sensitized in this mode are assigned a 0 or a 1 value.

56. The computer program product of claim 47 wherein:

said digital circuit is received in the form of a circuit graph;

said timing models include timing edges and delays; and said determining at least one mode of circuit operation is performed by first determining control signals of said digital circuit.

57. The computer program product of claim 56 wherein deriving a sub-circuit for each of said modes is done by:

applying values corresponding to each of said modes to said control signals;

propagating said control signal values through the circuit graph for each of said modes; and removing disabled timing edges from the circuit graph to create a modified circuit graph for each of said nodes.

58. The computer program product of claim 57 further including:

disabling timing edges including those timing edges through which no signal propagates in each of said modes.

59. The computer program product of claim 47 wherein said determining an overall maximum circuit delay includes identifying a mode containing a maximum delay.

60. A computer program product stored on computer readable media comprising computer code for implementing a method of performing a global timing analysis of a proposed digital circuit comprising steps of:

receiving timing models and said proposed digital circuit, the proposed digital circuit being produced as a result of software pipelining;

determining a plurality of modes of circuit operation of said proposed digital circuit;

deriving a sub-circuit corresponding to each of said modes of circuit operation;

performing timing analysis on each of said sub-circuits derived corresponding to each of said modes; and combining the timing analysis results for said modes to determine an overall maximum circuit delay.

61. The computer program product of claim 60 wherein the proposed digital circuit is further produced as a result of modulo scheduling.

62. The computer program product of claim 60 wherein the proposed digital circuit is further produced by PICO-NPA synthesis.

* * * * *